(12) United States Patent
Sato et al.

(10) Patent No.: US 7,889,508 B2
(45) Date of Patent: Feb. 15, 2011

(54) PLUG-IN UNIT-MOUNTING STRUCTURE AND ELECTRONIC APPARATUS

(75) Inventors: Yoshiyuki Sato, Kawasaki (JP); Mitsuo Fujimura, Kawasaki (JP); Hideo Araki, Kawasaki (JP); Hideki Zenitani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 44 days.

(21) Appl. No.: 11/715,953

(22) Filed: Mar. 9, 2007

(65) Prior Publication Data

US 2008/0043451 A1 Feb. 21, 2008

(30) Foreign Application Priority Data

Aug. 17, 2006 (JP) ............................. 2006-222172

(51) Int. Cl.
*H05K 7/10* (2006.01)
(52) U.S. Cl. ..................... 361/756; 361/796; 361/788; 361/741; 361/802
(58) Field of Classification Search .............. 361/756, 361/788, 796, 741, 802
See application file for complete search history.

(56) References Cited

U.S. PATENT DOCUMENTS

| | | | | | |
|---|---|---|---|---|---|
| 3,704,394 | A | * | 11/1972 | Johnson | 361/802 |
| 3,711,814 | A | * | 1/1973 | Pomella et al. | 439/377 |
| 3,775,643 | A | * | 11/1973 | Schachnow et al. | 361/759 |
| 4,239,323 | A | * | 12/1980 | Tamburro | 439/64 |
| 4,377,315 | A | * | 3/1983 | Grau | 439/59 |
| 4,466,049 | A | * | 8/1984 | Chaney et al. | 361/691 |
| 5,216,578 | A | * | 6/1993 | Zenitani et al. | 361/690 |
| 5,650,917 | A | * | 7/1997 | Hsu | 361/759 |
| 6,008,995 | A | * | 12/1999 | Pusateri et al. | 361/796 |
| 6,166,920 | A | * | 12/2000 | Schweers et al. | 361/801 |
| 6,198,633 | B1 | * | 3/2001 | Lehman et al. | 361/756 |
| 6,552,915 | B2 | * | 4/2003 | Takahashi et al. | 361/796 |
| 6,643,141 | B2 | * | 11/2003 | Kaetsu et al. | 361/797 |
| 7,172,443 | B1 | * | 2/2007 | Ju | 439/159 |
| 2002/0145858 | A1 | * | 10/2002 | Hayashi et al. | 361/798 |

FOREIGN PATENT DOCUMENTS

| | | |
|---|---|---|
| JP | 61-125094 U | 8/1986 |
| JP | 3-155198 A | 7/1991 |
| JP | 6-69669 A | 3/1994 |
| JP | 7-336075 A | 12/1995 |
| JP | 10-335854 A | 12/1998 |
| JP | 2005-277281 | 6/2005 |

OTHER PUBLICATIONS

Japanese Office Action issued on Nov. 9, 2010 for Japanese Application No. 2006-222172. A partial English-language translation is provided for the Examiner's information.

* cited by examiner

*Primary Examiner*—Dameon E Levi
(74) *Attorney, Agent, or Firm*—Fujitsu Patent Center

(57) ABSTRACT

A plug-in unit-mounting structure which makes it possible to efficiently mount plug-in units having different sizes in all slots. PIUs of printed board type which are different in size are mounted using respective mounting frames associated therewith. Box-shaped PIUs are also mounted using respective mounting frame associated therewith. However, no guide rail is provided on the metal shelf per se, for guiding each PIU for mounting the same therein.

13 Claims, 12 Drawing Sheets

PLUG-IN UNIT-MOUNTING STRUCTURE AND ELECTRONIC APPARATUS

CROSS-REFERENCE TO RELATED APPLICATIONS

This application is based upon and claims the benefits of priority from the prior Japanese Patent Application No. 2006-222172, filed on Aug. 17, 2006, the entire contents of which are incorporated herein by reference.

BACKGROUND OF THE INVENTION

1. Field of the Invention

This invention relates to a plug-in unit-mounting structure for mounting plug-in units each having various circuit packages mounted on a printed board thereof, and an electronic apparatus, and more particularly to a plug-in unit-mounting structure of a bookshelf-type electronic apparatus for removably mounting plug-in units.

2. Description of the Related Art

Electronic apparatuses for communication, such as transmitters and switchboards, use a bookshelf-type electronic apparatus in which a plurality of printed board units (hereinafter referred to as "PIUs") each comprised of electronic circuit packages are vertically mounted on a back wiring board (BWB) mounted on the rear face of a metal shelf thereof. The PIU is comprised of a printed wiring board and a plurality of electronic circuit packages each formed with electronic circuits, such as LSIs, mounted on the printed wiring board. There have been already proposed several plug-in unit-mounting techniques for mounting plug-in units on the BWB.

FIG. 10 is a front view of an example of a conventional plug-in unit-mounting structure.

In the illustrated example, pairs of substantially C-shaped guide rails 103a and 103b are secured to a metal shelf 100 at respective locations of upper and lower sides 101 and 102 of the metal shelf 100 at equal space intervals in a manner opposed to each other. Box-shaped full-size PIUs 104 can be vertically mounted in the metal shelf 100 using the guide rails 103a and 103b as guides. Further, by providing an intermediate guide member between the upper guide rail 103a and the lower guide rail 103b in the metal shelf 100, and attaching a center rail 105 to the intermediate guide member, it is possible to mount a half-size box-shaped PIU 106 at an upper shelf using the center rail 105 and the upper guide rail 103a as guides. Further, a half-size PIU 107 can be mounted at a lower shelf between the lower guide rail 103b and the center rail 105, by causing the rails as guides.

Therefore, PIUs 104 and 106 having various sizes can be mounted on the back wiring board of the metal shelf 100 shown in FIG. 10, and hence it is possible to simplify the design of e.g. a package-type communication apparatus, which improves not only economy but also the convenience of maintenance. It should be noted that a description of such a communication apparatus and a plug-in unit is given e.g. in International Publication Number WO 00/074454 (Section of "Outline of Construction of Communication Apparatus 10" in Detailed Description, and FIG. 1).

FIG. 11 is a front view of another example of the plug-in unit-mounting structure.

In the illustrated example, substantially C-shaped guide rails 202 are mounted on a wiring board 201 of a metal shelf 200 in a cantilever manner such that they protrude forward and are inwardly opposed to each other. The vertical distances between locations where the guide rails 202 are mounted are determined in a manner adapted to respective PIUs to be mounted on the back wiring board 201, e.g. a full-size PIU 203 and a half-size PIU 204. The PIUs 203 and 204, which are both box-shaped, have bar-shaped guides (not shown) mounted along two opposed sides which are orthogonal to sides where connectors are mounted, whereby the PIUs 203 and 204 are guided by the guide rails 202.

A description of such a printed board unit-holding structure of electronic units is given e.g. in Japanese Laid-Open Patent Publication No. 04-113693 (fourth and fifth pages, and FIGS. 1 and 3). When mounting printed board units having different sizes, they are formed as the box-shaped PIUs 203 and 204, and are mounted using the guide rails 202 attached to the back wiring board 201 according to the respective heights of the PIUs 203 and 204. This is advantageous in that the printed board units can be mounted in high density without the waste of space.

FIG. 12 is a front view of another example of the plug-in unit-mounting structure.

In this plug-in unit-mounting structure, substantially C-shaped guide rails 303a and 303b are fixed to an upper side 301 and a lower side 302 of a metal shelf 300 in a manner opposed to each other, and printed board-type full-size PIUs 304 are mounted using the guide rails 303a and 303b as guides. Further, some of the guide rails 303a and 303b fixed to the metal shelf 300 hold printed board unit-mounting frames 305. Each mounting frame 305 has center rails 305a and 305b integrally formed therewith, and grooves 305c formed in the top and bottom thereof, for engagement with the guide rails 303a and 303b (e.g. Japanese Laid-Open Patent Publication (Kokai) No. 2005-277281 (Paragraph Numbers [0010] to [0024] and FIG. 1)).

By using the printed board unit-mounting frame 305, a half-size PIU 306 of printed board type is mounted at an upper shelf by being guided between the guide rail 303a and the center rail 305a of the printed board unit-mounting frame 305, and another half-size PIU 306 of printed board type is also mounted on a lower shelf by being guided between the guide rail 303b and the center rail 305b of the printed board unit-mounting frame 305.

In the illustrated example, only by fixing the guide rails 303a and 303b to opposed sides of the metal shelf 300, it is possible to cope with plug-in units having different sizes. Therefore, as distinct from the case of the metal shelf 100 shown in FIG. 10, it is not necessary to provide the intermediate guide member and attach the center rail 105 thereto, which makes it possible to perform high-density mounting using a smaller number of components. Further, as distinct from the metal shelf 200 shown in FIG. 11, it is not required to mount the guide rail 202 on the back wiring board 201 in a manner adapted to the size of a printed board unit. Therefore, even when a printed board unit already mounted in the metal shelf 300 is replaced by a printed board unit having a different size, it is possible to easily mount a printed board unit having a desired width at a predetermined location.

However, in both of the FIG. 10 and FIG. 12 examples of the conventional printed board unit-mounting structure, described above, the guide rails for guiding the PIUs are mounted on the metal shelves 100 and 300 per se. In general, the number of layers of a printed circuit board increases or decreases depending on the amount of wiring, and hence as the amount of wiring becomes larger, the thickness of the printed circuit board inevitably tends to increase. On the other hand, when the upper and lower sides of a plug-in unit (PIU) are held by the guide rails 303a and 303b, the width of the guide rails corresponds to the thickness of the printed circuit board, and hence it is difficult to replace the printed circuit board (PCB) in use with a printed circuit board having a larger amount of wiring and hence having a different thickness.

More specifically, the guide mechanism (guide rails 103a and 103b) for mounting the box-shaped PIUs 104 and 106, described hereinabove with reference to FIG. 10, is configured to be integrally formed with the metal shelf 100. Therefore, there is a problem that the thickness of PIUs that can be mounted in slots is fixed.

Further, in the case of the metal shelf 300 for having the PIUs 304 and 306 of printed board type mounted therein, shown in FIG. 12, the substantially C-shaped guide rails 303a and 303b fixed to the upper and lower sides 301 and 302 in a manner opposed to each other are used, and hence if a plug-in unit has a different thickness, as in the case of a plug-in unit in which a heat sink provided with a radiation fin is arranged on a PCB, it is difficult to mount the plug-in unit. What is more, when mounting a box-shaped PIU without containing a PCB, it is required, to begin with, to provide guide rails for guiding the box-shaped PIU, in place of the fixed guide rails 303a and 303b.

On the other hand, the FIG. 11 metal shelf 200 for mounting the box-shaped PIUs 203 and 204 is adapted only to the box-shaped PIUs 203 and 204, and hence it is impossible to mount plug-in units having a printed board exposed without being covered with a box-shaped covering. Further, since the opposed guide rails 202 are separately fixed to the back wiring board 201, and hence, the distance between the opposed guide rails is sometimes not uniform due to variations of parts thereof.

As described above, the conventional electronic apparatuses suffer from the problem that it is not easy to replace PIUs mounted on a shelf or increase or reduce the number of mounting frames e.g. when changing the design of the apparatuses.

SUMMARY OF THE INVENTION

The present invention has been made in view of the above-described problems, and an object thereof is to provide a plug-in unit-mounting structure which makes it possible to efficiently mount plug-in units having different sizes in all slots without being dependent on the structure of the shelves.

Another object of the invention is to provide an electronic apparatus which allows PIUs to be mounted in slots of shelves to have a high freedom of design in changing the design thereof.

To attain the above object, the present invention provides a plug-in unit-mounting structure for mounting plug-in units each having various circuit packages mounted on a printed board thereof. The plug-in unit-mounting structure is characterized by comprising a shelf that includes a back wiring board, and has connectors disposed on the back wiring board, for being fitted to the plug-in units, and a mounting frame that receives the plug-in unit on the shelf and has at least one plug-in unit mounted thereon in a state in which the plug-in unit can be fitted to an associated one of the connectors, and the mounting frame has provided thereon guide rails which are predetermined depending a size of the plug-in unit.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
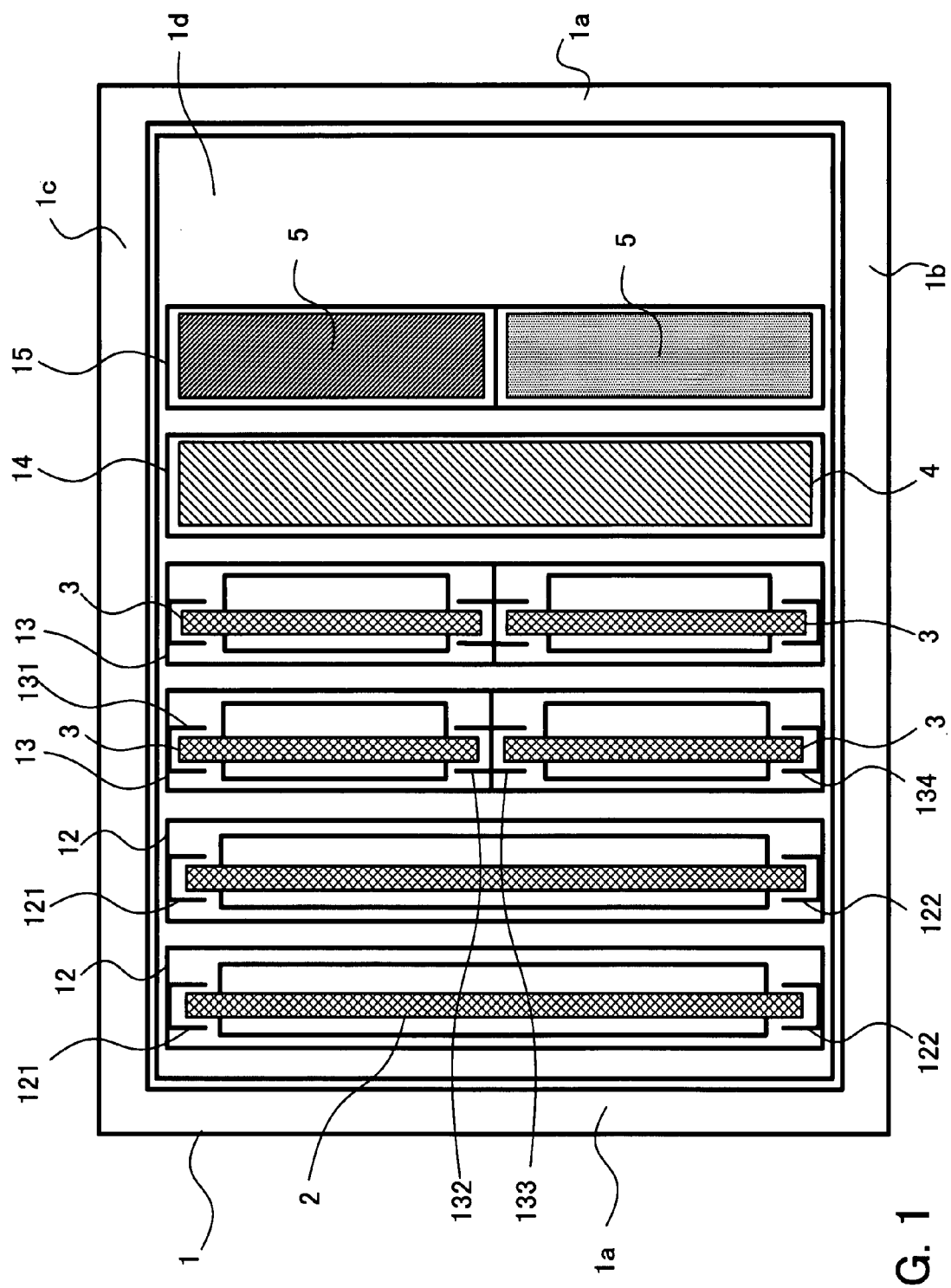
FIG. 1 is a front view of an electronic apparatus according to an embodiment of the present invention.

The invention will now be described in detail with reference to drawings showing preferred embodiments thereof. FIG. 1 is a front view of an electronic apparatus according to an embodiment of the present invention.

A metal shelf 1 of the electronic apparatus forms a sub-rack having a pair of side boards 1a, a bottom board 1b, a top board 1c having a rear side thereof inclined upward, and a rear board (back wiring board) 1d. On this sub-rack, full-size plug-in units (PIUs) 2 are mounted using respective full-size mounting frames 12, and two half-size plug-in units (PIUs) 3 are mounted on each of half-size mounting frames 13. These components form the electronic apparatus together with box-shaped PIUs 4 and 5.

For the full-size PIUs 2 and 4, there are provided the full-size mounting frame 12 and a full-size mounting frame 14, while for the half-size PIUs 3 and 5, there are provided the half-size mounting frame 13 and a half-size mounting frame 15. The full-size mounting frame 12 has inward-facing guide rails 121 and 122 provided at respective upper and lower-side locations thereof opposed to each other, for mounting the PIU 2, which is of printed board type. The half-size mounting frame 13 has an inward-facing guide rail 131 and a center rail 132 provided at respective upper-side and central locations thereof, and a center rail 133 and an inward-facing guide rail 134 provided at respective central and lower-side locations thereof in a manner opposed to each other. The full-size PIU 2 has upper and lower ends thereof held by the guide rails 121 and 122 of the mounting frame 12, and the half-size PIUs 3 have upper and lower ends thereof held by the guide rails 131 and 134 and the center rails 132 and 133 at the center.

The metal shelf 1 of the electronic apparatus is characterized in that the PIUs 2 and 3 of printed board type which are different in size can be mounted using respective associated mounting frames 12 and 13. Further, the box-shaped PIUs 4 and 5 can be mounted using respective associated mounting frames 14 and 15. Moreover, no guide rails for guiding the PIUs 2 to 5 for mounting them are provided on the metal shelf 1 per se.

As described above, the electronic apparatus has no rail mechanism fixed to the metal shelf 1. Therefore, it is possible to use the mounting frames 12 to 15 by properly combining therewith the PIUs 2 and 3 of printed board type and the box-shaped PIUs 4 and 5. Therefore, the electronic apparatus comprised of PIUs mounted on the same metal shelf 1 has a high degree of freedom of configuration.

Next, a description will be given of details of the plug-in unit-mounting structure applied to a bookshelf-type electronic apparatus.

Figure 2:
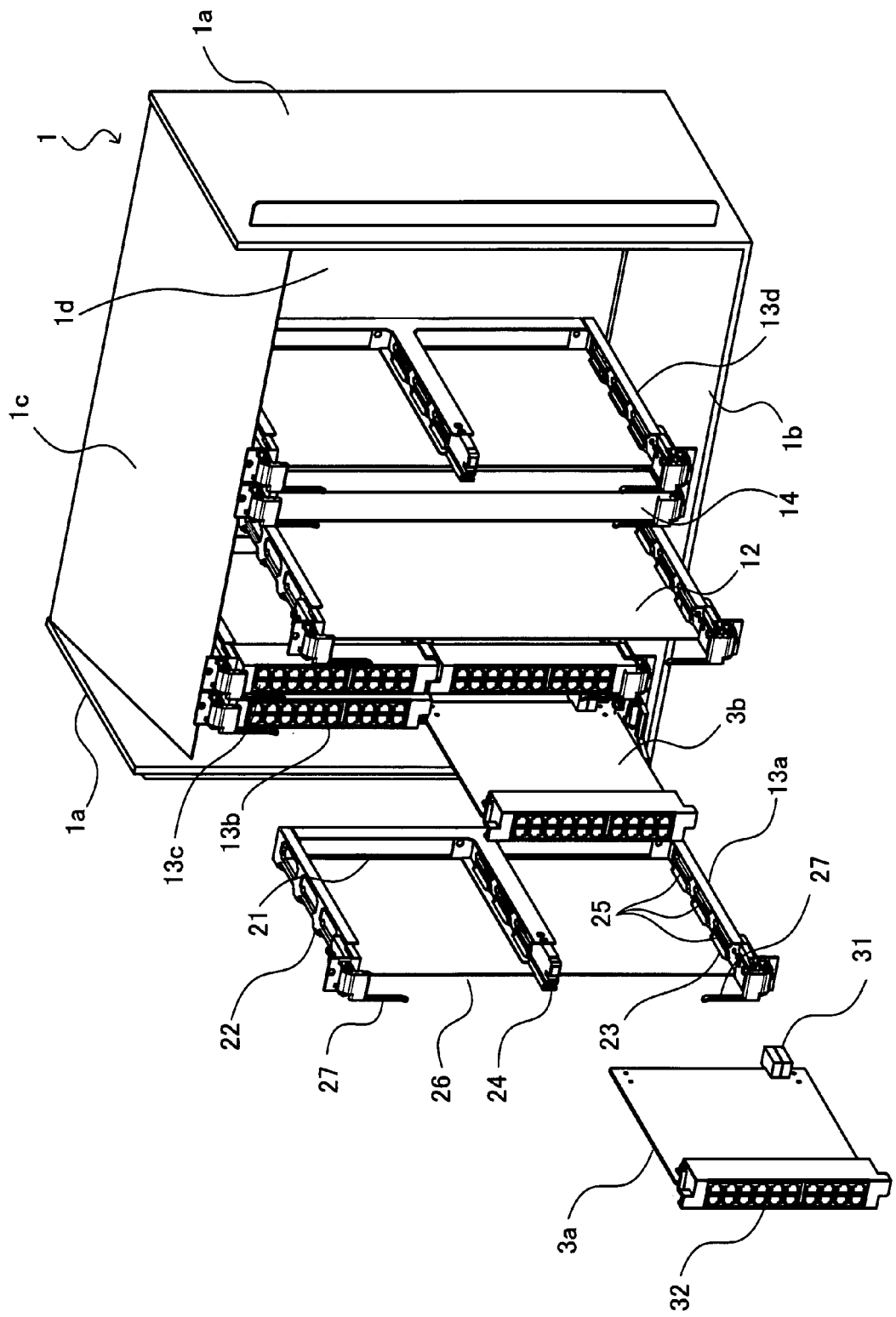
FIG. 2 is a perspective view of a plug-in unit-mounting structure according to the embodiment.

FIG. 2 is a perspective view of the plug-in unit-mounting structure according to the present embodiment. Members appearing FIG. 2 which correspond to those in FIG. 1 are designated by the same reference numerals.

In this electronic apparatus, connectors (not shown) which can be fitted to plug-in units are disposed on the back wiring board 1d of the metal shelf 1, and the mounting frames 12 to 14 adapted to various plug-in units are received side by side in the longitudinal direction of the metal shelf 1 in a predetermined arrangement. These mounting frames 12 and 14 are each comprised of a vertical frame part 21 to be pushed in toward the back wiring board 1d, and an upper frame part 22 and a lower frame part 23 horizontally fixed to upper and lower ends of the vertical frame part 21 and having a length corresponding to the depth of the metal shelf 1. The mounting frame 13 is further comprised of an auxiliary frame part 24 horizontally fixed to a desired intermediate location of the vertical frame part 21, in addition to above-mentioned component elements. Then, as explicitly shown in a mounting frame 13a in a state drawn out from the metal shelf 1, the frame parts 22 to 24 are formed with rail portions 25 for guiding the PIU 3a, and a side partition board 26. In the present embodiment, the rail portions 25 are formed by shaping respective portions of sheet metal such that they extend upward, but they may be formed e.g. by attaching separate parts formed by grooving a resin or the like.

The side partition board 26 is provided for separating between plug-in units mounted at adjacent locations in the metal shelf 1. This makes it possible to prevent the whole electronic apparatus from being burned out even when a circuit device of an adjacent PIU produces a fire or suffers from an accident of burning, as well as protect the internal circuit packages from being thermally affected by each other.

Further, the mounting frame 13a has a card lever 27 disposed therein in a manner associated with a front slot of the metal shelf 1, for inserting and removing the PIU 3a. The card lever 27 is provided at each of respective front ends of the upper frame part 22 and the lower frame part 23 of the mounting fame 13a, and as described hereinafter, enables an inserting or removing force to be applied to the PIU 3a in pushing the inserted PIU 3a toward the back wiring board 1d or in drawing the same in an opposite direction.

The PIU 3a has a size (half size) which is half the size of the full-size PIU to be mounted on the back wiring board 1d of the metal shelf 1, with a connector 31 provided at an end side thereof in an inserting direction, and a front panel (display board) 32 at an end side opposite thereto. It should be noted that in addition to the half-size mounting frames 13a, in the illustrated example of FIG. 2, mounting frames 13b to 13d having the same construction are inserted from respective predetermined front slots of the metal shelf 1 and received therein.

The PIU 3a appearing in FIG. 2 is mounted after the mounting frame 13a is received in the metal shelf 1.

The electronic apparatus is capable of having full-size PIUs mounted on the back wiring board 1d of the metal shelf 1 by using the full-size mounting frames 12 and 14. Further, when mounting the PIUs of printed board type having sizes other than the half-size, it is only required to change the position of the auxiliary frame 24 to be horizontally fixed to the vertical frame part 21, according to the size of a plug-in unit to be mounted therein.

As described above, according to the plug-in unit-mounting structure of the present embodiment, by removably mounting the mounting frames 12 to 14 for plug-in units, in the bookshelf-type apparatus, it is possible to efficiently mount the plug-in units different in size by guiding the same along the rail portions 25 provided on the mounting frames. The guide mechanism (guide rails) for PIUs has been conventionally configured to be integrally formed with the shelf, and hence the mountable PIUs has a fixed or predetermined configuration. In contrast, the plug-in unit-mounting structure in which the configuration of the mounting frame itself is variable is capable of having mounted therein plug-in units having any shape, including the box-shaped PIUs 4 and 5 by preparing the mounting frames 12 to 14 fitted to the shape of PIU to be mounted.

Further, when a frame, such as the mounting frame 14, is used which receives a plurality of printed boards in a box-shaped casing thereof, it is possible to increase the number of plug-in units mountable in the mounting frames. Moreover, by properly adjusting the locations of provision or attachment of the rail portions 25 on the mounting frames 12 to 14, it is possible to flexibly change and set the location of an area in the direction of width of a PIU where a printed board is to be inserted, and hence it is possible give some degree of freedom e.g. to the design of circuit packages to be mounted on a printed board, concerning restrictions on the height of mounted components, which extends in the longitudinal direction in the illustrated example.

Figures 3A, 3B, 3C:
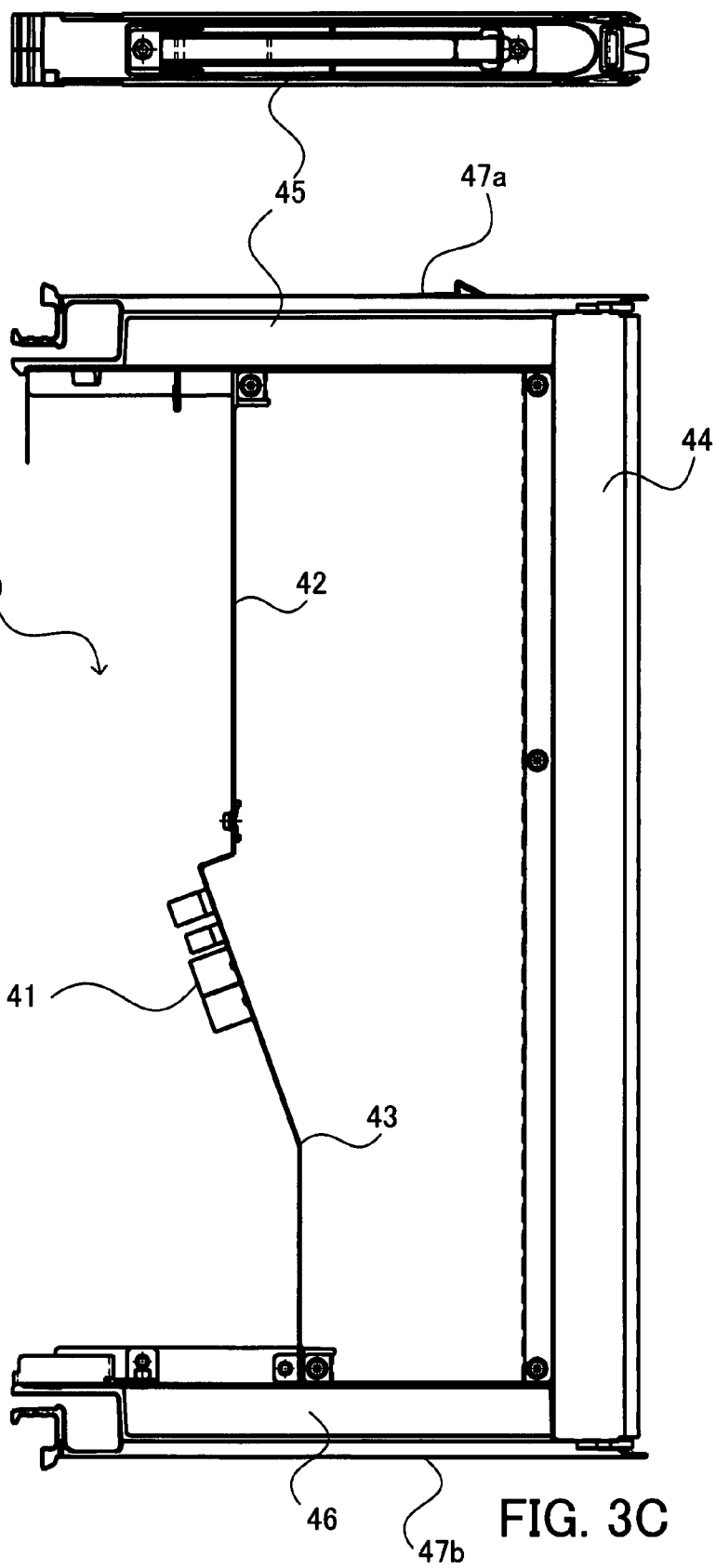
FIG. 3A is a plan view of a plug-in unit having a connector conversion panel mounted thereon.
FIG. 3B is a front view of the plug-in unit.
FIG. 3C is a side view of the plug-in unit.

FIG. 3A is a plan view of a plug-in unit on which a connector conversion panel is mounted, and FIGS. 3B and 3C are a front view and a side view of the same, respectively.

The connector conversion panel 40 is a box-shaped unit comprised of guide edges 47a and 47b provided at respective top and bottom sides thereof, for being guided by the full-size mounting frame 14, and an optical connector 41, but without provision of a printed circuit board. In the illustrated example, the optical connector 41 is held by support plates 42 and 43 having respective predetermined shapes at a predetermined height between an upper frame part 45 and a lower frame part 46 horizontally fixed to respective upper and lower ends of the vertical frame part 44. This connector conversion panel 40 is an example of the full-size PIU 4 appearing in FIG. 2, and is mounted as the box-shaped unit in the metal shelf 1 as shown in FIG. 2.

As another example of the box-shaped unit to be mounted by the full-size mounting frame 14, there may be mentioned a fiber extra length-handling panel. In a slot of the metal shelf 1 where a PIU is not mounted, a filler unit provided with a dummy panel may be mounted using the full-size mounting frame 14.

Figure 4:
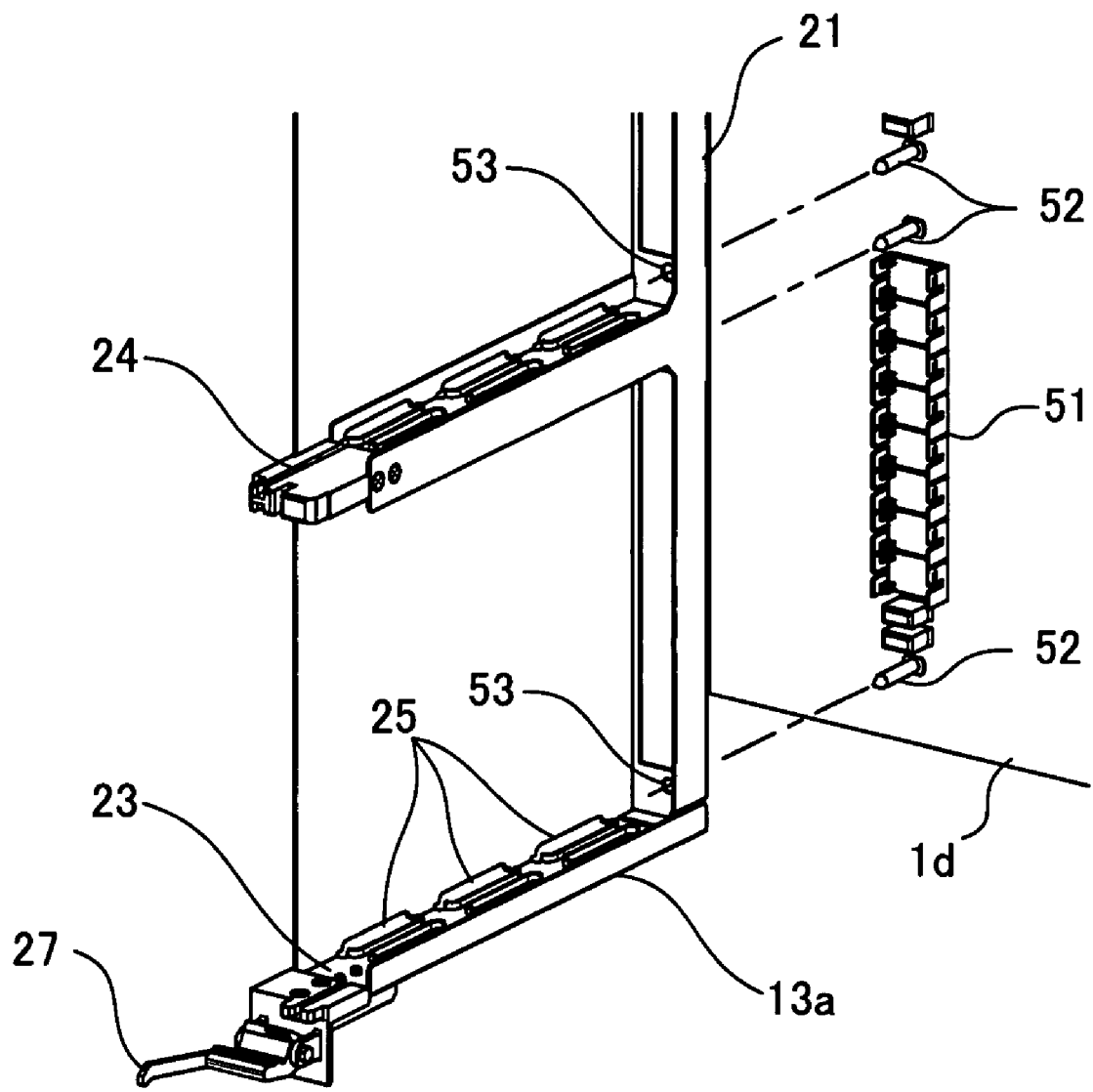
FIG. 4 is a view useful in explaining the relationship between a mounting frame and a connector disposed on a back wiring board, according to the embodiment.

FIG. 4 is a view useful in explaining the relationship between the mounting frame and the connector disposed on the back wiring board, according to the present embodiment.

For example, when a plug-in unit is mounted on the plug-in connector 51 disposed on the back wiring board 1d, using the mounting frame 13a, unless the plug-in unit is accurately positioned with respect to the connector 51 of the mounting frame 13a, there may be caused not only the problem of insufficient electrical connection, but also the problem that a fitting operation performed with insufficient positioning of the plug-in connectors 51 and 31 prevents the respective housings of the connectors from being normally fitted to each other, which in the worst case cause damage to the connectors. To avoid this problem, a predetermined number of guide pins 52 are disposed at respective predetermined locations of the back wiring board 1d, while positioning guide holes 53 are formed in the mounting frame 13, whereby it is possible to accurately position and mount the plug-in unit in the plug-in connector.

Figure 5:
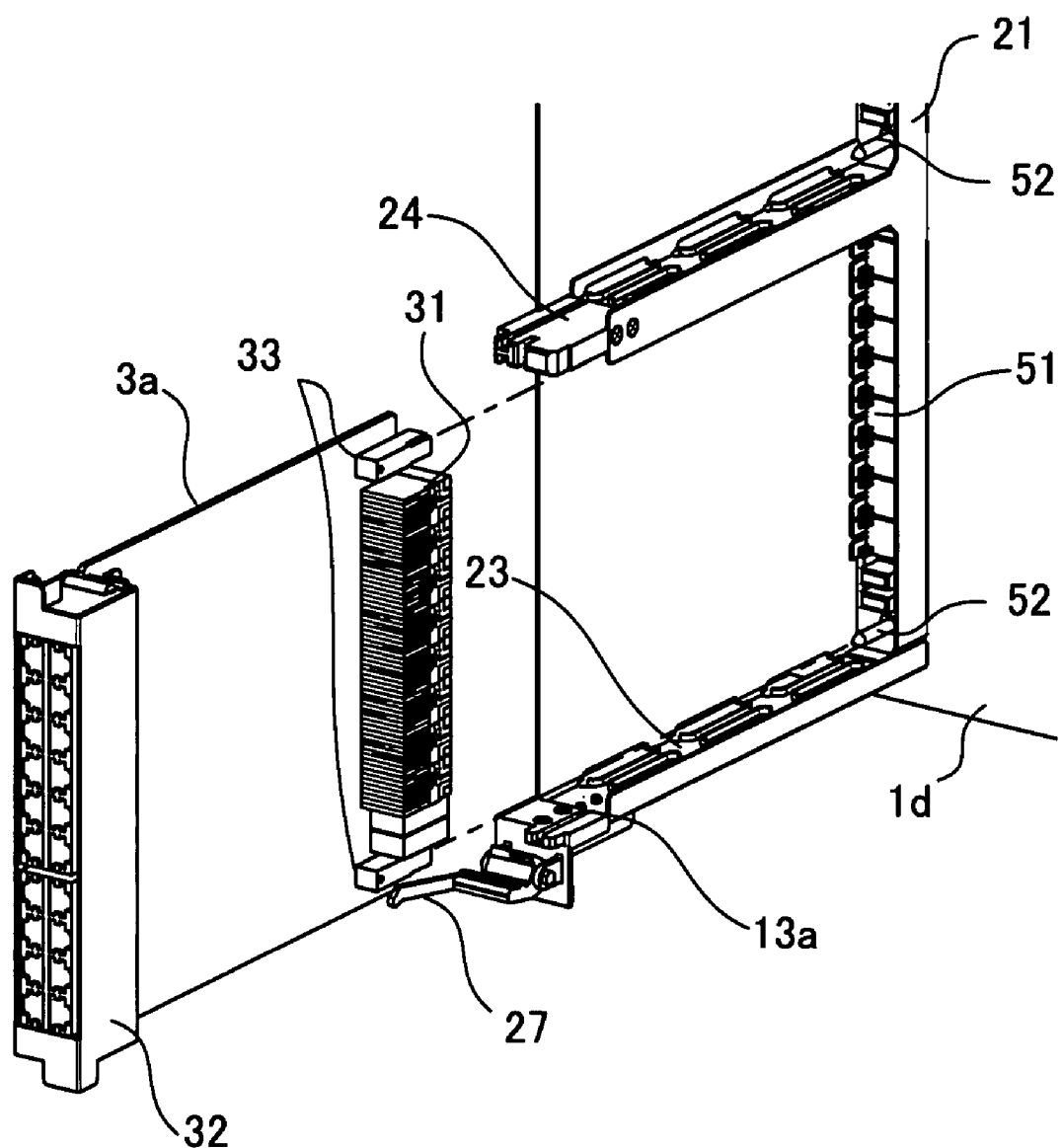
FIG. 5 is a view useful in explaining the relationship between the plug-in unit and the mounting frame, according to the embodiment.

In the illustrated example, the guide holes 53 of the mounting frames 13a are formed at respective locations of the vertical fame part 21 corresponding to locations close to the top and bottom of the plug-in connector 31, and by inserting the guide pins 52 in the guide holes 53, the positioning is effected. As a result, as shown next in FIG. 5, it is possible to accurately attach the mounting frame 13a to the plug-in connector 51 disposed on the back wiring board 1d, and then, the PIU 3a has only to be guided using the rail portions 25 of the mounting frame 13a.

Figure 6:
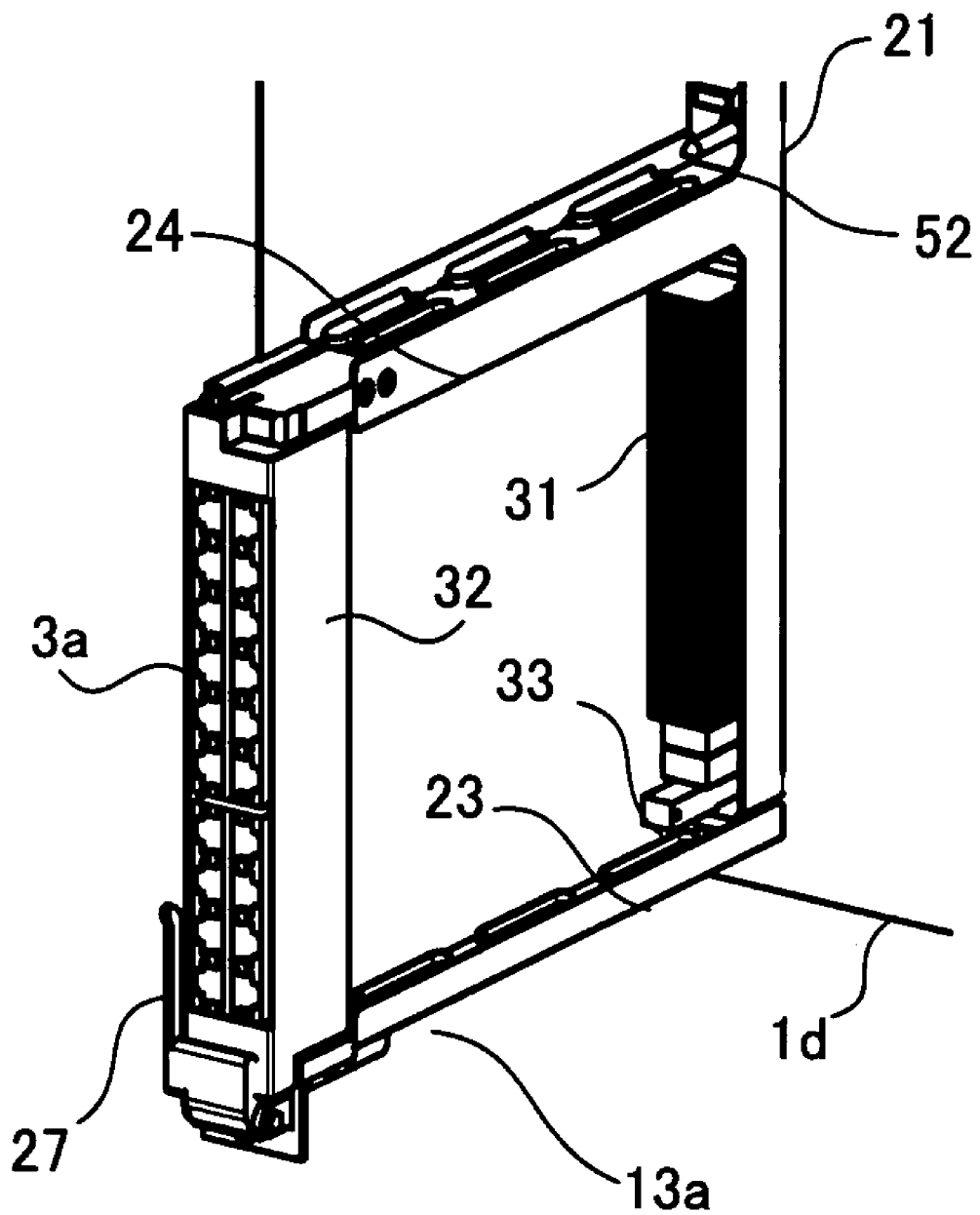
FIG. 6 is a view useful in explaining a state of the electronic apparatus in which fitting of the plug-in unit to the mounting frame is completed, according to the embodiment.

At this time, the card lever 27 provided on the lower frame part 23 is in a state fell forward so as to prevent the same from offering an obstacle to the PIU 3a which is to be guided by the rail portions 25 of the mounting frame 13a. Further, by forming the guide pins 52 attached to the back wiring board 1d such that they have such a length as will protrude into the inside of the mounting frame 13a, it is possible to easily carry out the positioning of the back wiring board 1d and the PIU 3a, by fitting the guide pins 52 in guide modules 33 of the PIU 3a. FIG. 6 shows a state in which the fitting of the plug-in unit (PIU 3a) in the mounting frame 13 is completed.

As shown in FIG. 6, by pivotally moving the card lever 27 of the lower frame part 23 in a lifting manner, the urging force is applied to the front panel 32 of the PIU 3a inserted in the associated front slot of the metal shelf 1, whereby the fitting of the respective connectors 51 and 31 of the back wiring board 1d and the PIU 3a is completed.

As described above, the positioning of the back wiring board 1d and the mounting frame 13a is effected by fitting the guide pins 52 attached to the back wiring board 1d into the guide holes 53 formed in the mounting frame 13a, and further, the guide pins 52 are commonly used for positioning of the back wiring board 1d with respect to both the mounting frame 13a and the PIU 3a. This makes it unnecessary to provide the guide rails for guiding the PIUs 2 to 5, on the back wiring board 1d of the metal shelf 1. Therefore, it is possible to increase an area of the back wiring board 1d in which the plug-in connector 51 can be mounted, which makes it possible to realize the high density and multi-wiring system of the electronic apparatus.

Although in the embodiment described hereinabove, in association with the front slot of the metal shelf 1, the card lever 27 is provided at a front end of each of the upper frame part 22 and the lower frame part 23 of the mounting frame 13a, this is not limitative, but the card lever 27 may be attached e.g. to the front panel 32 of the PIU 3a, and be engaged with a strike plate (not shown) disposed at the front slot of the metal shelf 1, whereby the PIU 3a may be inserted or removed. Further, when it is necessary to collectively plug in a plurality of circuit packages, a plurality of units to be inserted and removed to and from slots adjacent to each other may be caused to be guided in unison by the mounting frames and inserted into the respective slots, by using a card lever having integrated those for the respective slots such that the units are collectively operable thereby.

Figure 7:
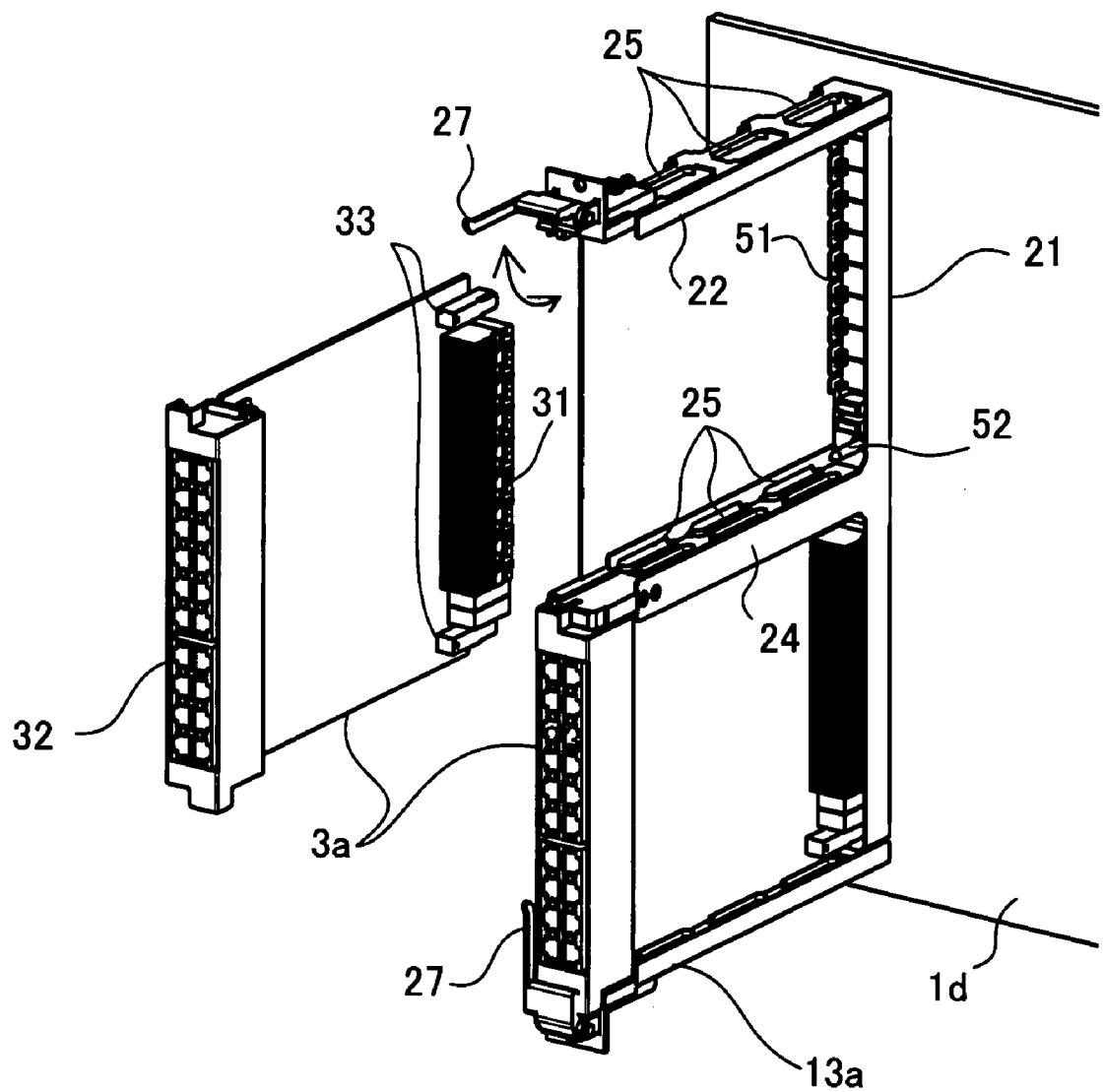
FIG. 7 is a view useful in explaining the relationship between the plug-in unit and the mounting frame, according to the embodiment.

FIG. 7 is a view useful in explaining the relationship between the plug-in unit and the mounting frame according to the embodiment.

In the illustrated example, the plug-in unit (PIU 3a) is mounted using the card lever 27 provided at the upper frame part 22 of the mounting frame 13a. More specifically, the PIU 3a is pushed in to a location close to the back wiring board 1d along the rail portions 25, and the card lever 27 is pivotally moved downward through 90° whereby a predetermined urging force is applied to the front panel 32 of the PIU 3a. This causes a predetermined force to act on the connector 31 for fitting the same to the connector 51, whereby firm fitting thereof can be effected. At this time, the guide pins 52 are fitted in the guide modules 33 of the PIU 3a, which makes it possible to facilitate the positioning of the back wiring board 1d and the PIU 3a.

Next, a description will be given of a plug-in unit-mounting structure using a mounting frame of mixed mounting type formed to have a frame width adapted to the thickness of a printed board to be mounted on the plug-in unit.

Figure 8:
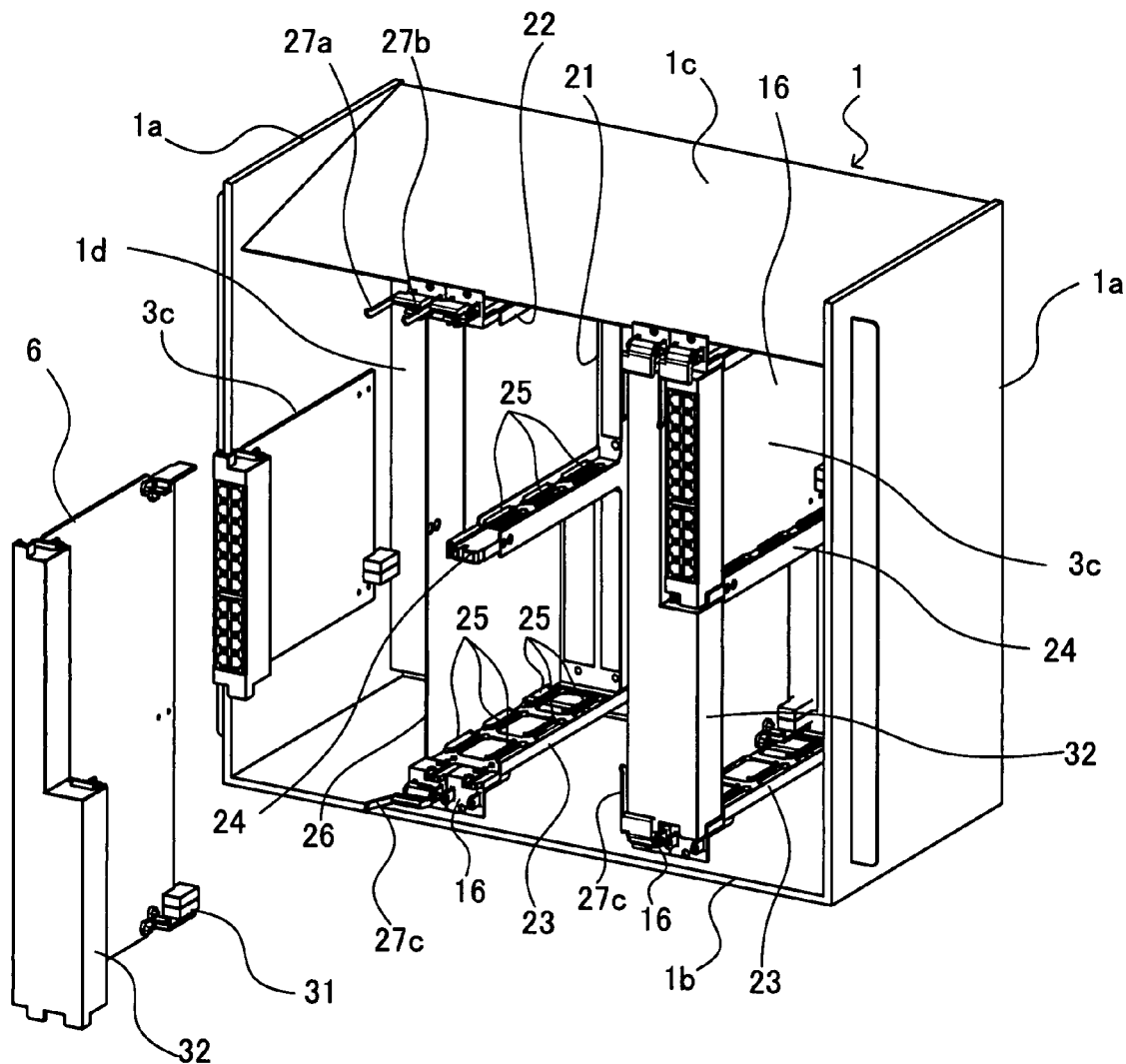
FIG. 8 is a perspective view of a plug-in unit-mounting structure according to another embodiment of the present invention.

FIG. 8 is a perspective view of a plug-in unit-mounting structure according to another embodiment of the present invention. In FIG. 8, members corresponding to those in FIG. 1 are designated by the same reference numerals.

In the back wiring board 1d of the metal shelf 1, connectors (not shown) that can be fitted to respective plug-in units are disposed, and mounting frames 16 of mixed mounting type are received in the metal shelf 1 side by side in a predetermined arrangement in the longitudinal direction. The mounting frames 16 are each comprised of a vertical frame part 21 to be pushed in toward the back wiring board 1d, an upper frame part 22 and a lower frame part 23 having a length corresponding to the depth of the metal shelf 1 which are horizontally fixed to upper and lower ends of the vertical frame part 21, and an auxiliary frame part 24 horizontally fixed to a desired intermediate location of the same vertical frame part 21. In the illustrated example, two rows of rail portions 25 are provided at the upper frame part 22 and the lower frame part 23, and one row of rail portions 25 are provided in the auxiliary frame 24. With these rail portions 25, the half-size PIU 3c and the full-size PIU 6 are guided.

As described above, in the mounting frame 16, a plurality of rows of rail portions 25 can be provided on the upper frame part 22 and the lower frame part 23 disposed on the upper and lower sides thereof or the auxiliary frame part 24 disposed at a desired intermediate location, according to the number of the PIUs 3c and the PIUs 6 to be mounted thereon. It should be noted that the side partition plate 26 is provided on the mounting frame 16.

Further, card levers 27a and 27b for inserting and removing the PIU 3c and the PIU 6 are disposed on the upper frame part 22 of the mounting frame 16 in association with each front slot of the metal shelf 1, and only one card lever 27c associated with the PIU 6 is disposed at a front end of the lower frame part 23.

The PIU 6 is a full-size plug-in unit on which an electronic circuit module that is thick and is provided with a radiation fin is mounted at a lower half of a printed board, with the plug-in connector 31 being provided at an end side in the direction of insertion to be performed when mounting, and the front panel (display board) 32 being provided at an opposite end side thereof. The PIU 3c has a size (half size) which is half the size of the full-size PIU, and is mounted by being guided between the upper frame part 22 and the auxiliary frame part 24 of the mounting frame 16. Therefore, the front panel 32 of the PIU 3c and the front panel 32 of the PIU 6 are integrated with each other to have a two-panel width.

As described above, the mounting frame 16 adapted to the sizes of the PIUs 3c and 6c are prepared in advance, and the PIUs 3c and 6c to be introduced into the electronic apparatus are assembled to the metal shelf 1 using the mounting frame 16 adapted to the sizes of the PIUs, which makes it possible to realize the plug-in unit-mounting structure which is enhanced in the freedom of layout of PIUs.

Although in the embodiment shown in FIG. 8, the mounting frame 16 prepared for the full-size and half-size plug-in units which are different in the size of height is used, this is not limitative, but the present invention is generally applicable to the mounting of plug-in units having special shapes, by preparing e.g. a mounting frame having a quarter size (the height thereof is ¼ of that of the full-size plug-in unit), or mounting frames having a two-panel width, a three-panel width, . . . , n-panel width, and so forth which are partially different in the dimension of width. It should be noted that the area of a plug-in unit is not limited to a rectangular shape as in the case of the front panel 32 of the embodiment shown in FIG. 8.

Figure 9:
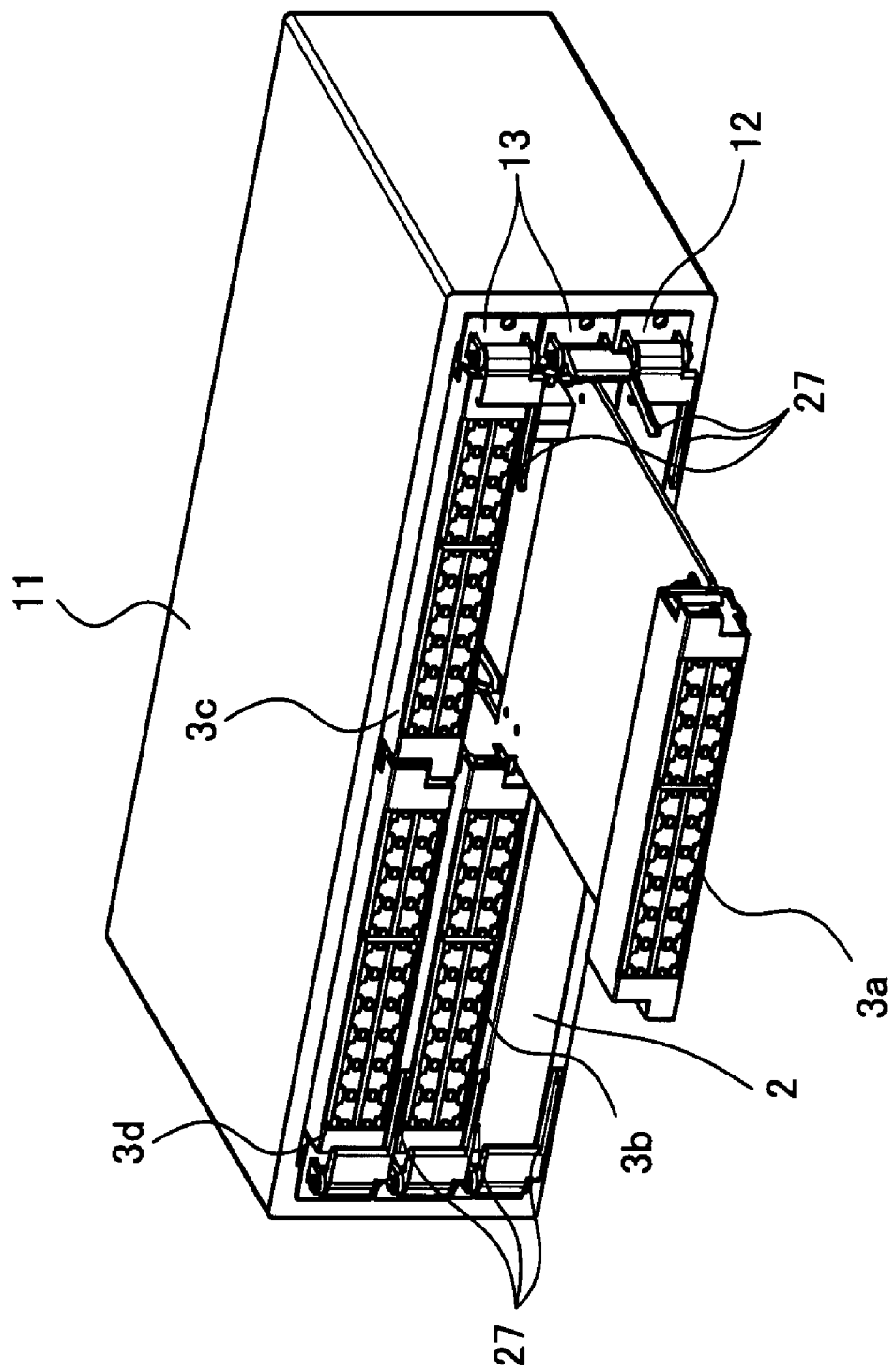
FIG. 9 is a perspective view of an electronic apparatus of horizontal mounting type, according to still another embodiment of the present invention.
Figure 10:
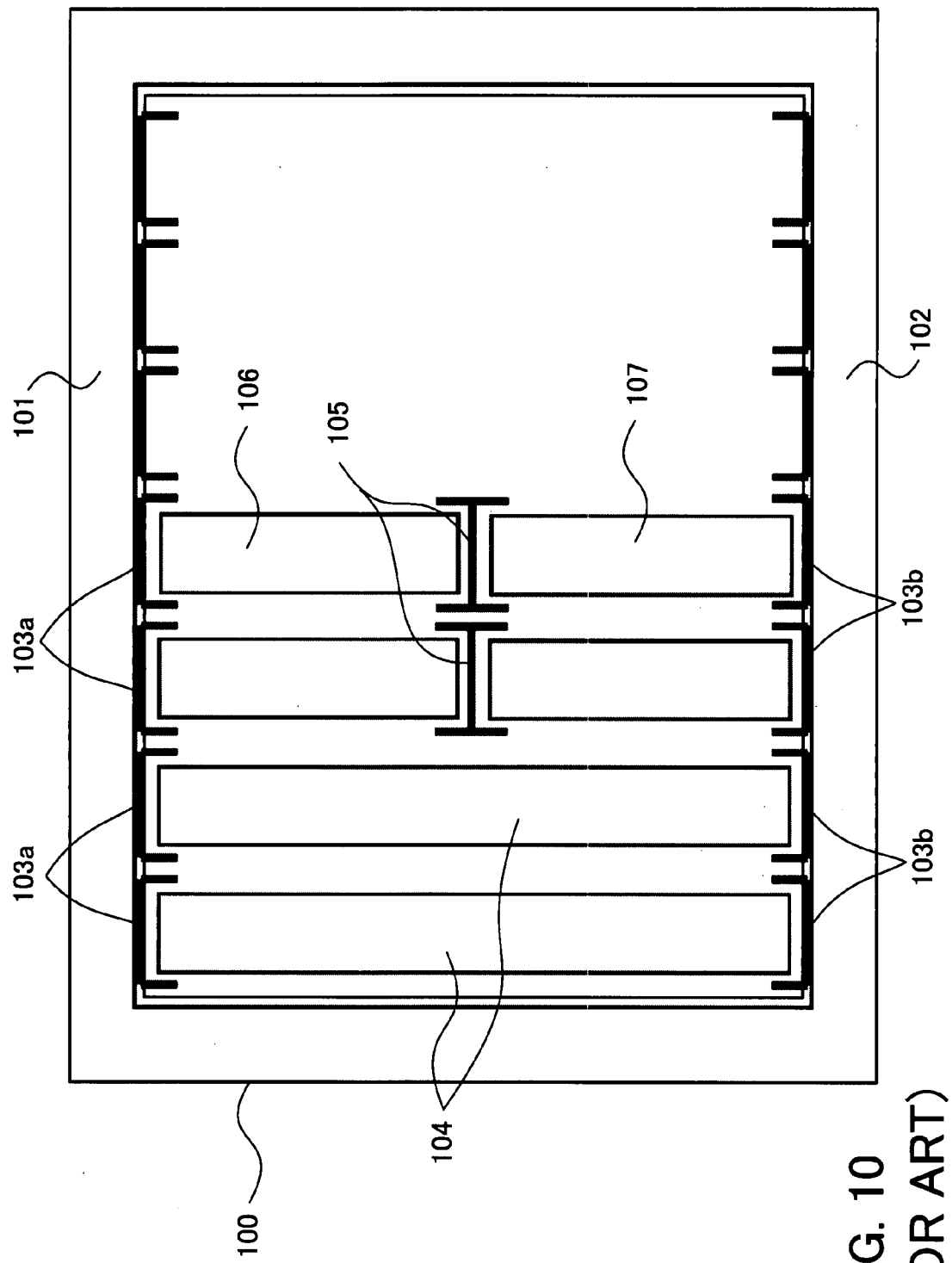
FIG. 10 is a front view of an example of a conventional plug-in unit-mounting structure.
Figure 11:
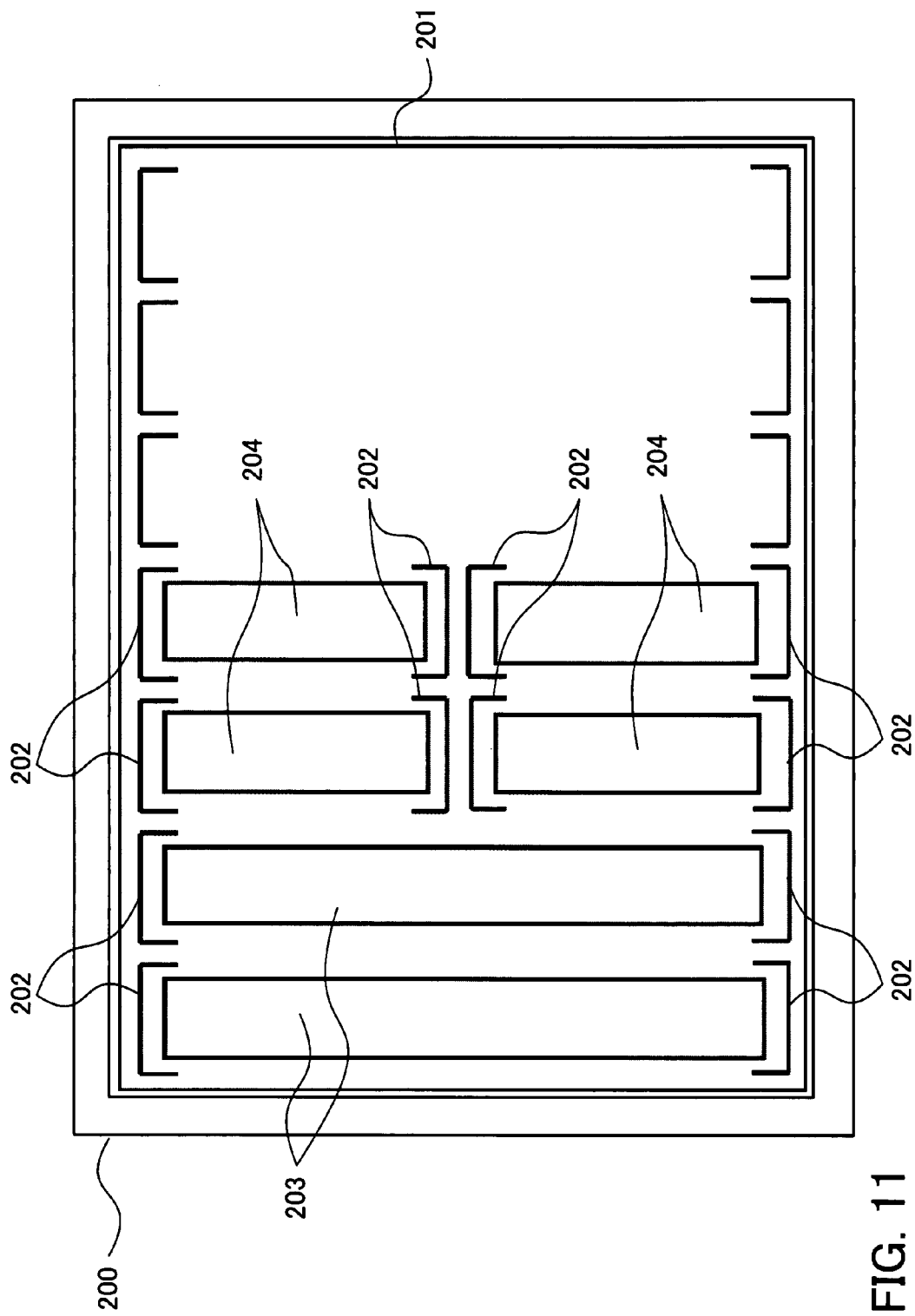
FIG. 11 is a front view of another example of the conventional plug-in unit-mounting structure.
Figure 12:
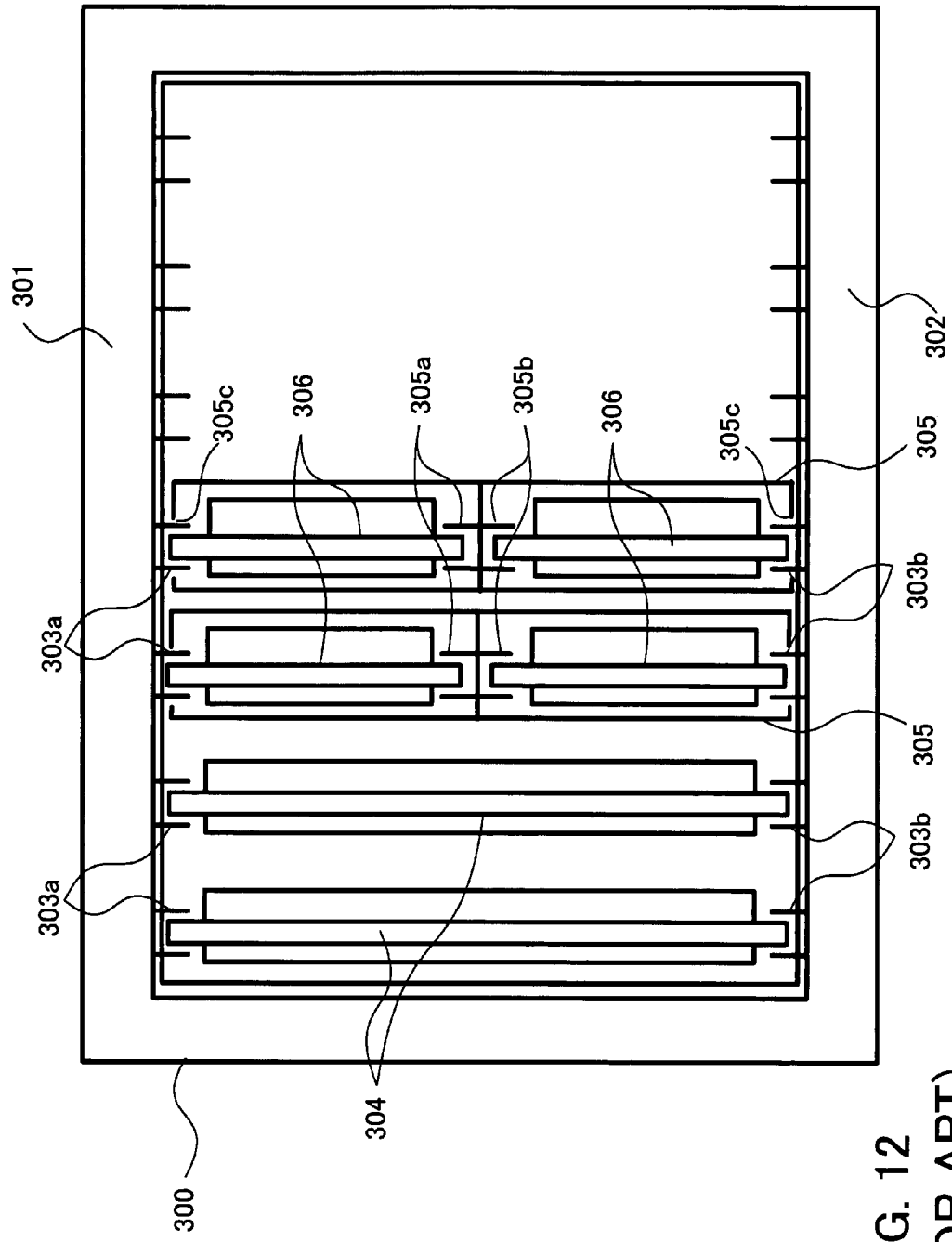
FIG. 12 is a front view of still another example of the conventional plug-in unit-mounting structure.

FIG. 9 is a perspective view of an electronic apparatus of horizontal mounting type according to a still another embodiment of the present invention.

In the illustrated example, mounting frames 12 and 13 similar to those shown in FIG. 2 are mounted in layers in the vertical direction of a metal shelf 11 which is horizontally oriented. Using the mounting frame 12, the full-size PIU 2 is mounted, and using the mounting frames 13, the half-size PIUs 3a, 3b, 3c, and 3d are mounted. The card levers 27 are provided at opposite longitudinal ends of the metal shelf 11.

By pivotally moving the card levers 27 provided for the PIUs 2, 3a, 3b, 3c, and 3d inserted in the mounting frames 12 and 13, it is possible to apply an inserting force when inserting them toward the back wiring board of the metal shelf 11, or a removing force when pulling them in an opposite direction. Therefore, the plug-in unit-mounting structure according to the present invention is advantageous in that the plug-in units and the mounting frames therefor can be commonly used for electronic apparatuses of vertical mounting type and those of horizontal mounting type.

According to the present invention, no rail mechanism is used which is fixed to the shelf, and therefore, irrespective of whether the PIUs to be mounted therein are box-shaped or of printed board type, by using respective mounting frames associated therewith, it is possible to realize a plug-in unit-mounting structure which is high in the freedom of configuration, for the same shelf.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A plug-in unit-mounting structure for mounting plug-in units each having various circuit packages mounted on a printed board thereof, the structure comprising:
 a shelf comprising a back wiring board, and connectors and guide pins disposed separately on said back wiring board, the connectors being located for engagement with the plug-in units; and
 a mounting frame, removably fixed to said shelf before receiving any plug-in units, that receives at least one plug-in unit in a state in which the plug-in unit is fitted to an associated one of said connectors, the mounting frame including:
 a vertical frame part having upper and lower ends and a guide hole for positioning said mounting frame in said shelf, such that said guide hole is engaged with one of the guide pins disposed on said back wiring board;
 upper and lower frame parts respectively fixed to the upper and lower ends of the vertical frame part; and
 guide rails which are provided on the upper and lower frame parts and have a length based on a size of the plug-in unit.

2. The plug-in unit-mounting structure according to claim 1, wherein said mounting frames are received in said shelf side by side in a longitudinal direction.

3. The plug-in unit-mounting structure according to claim 1, wherein said mounting frame is provided with a wall for separation from an adjacent one of the plug-in units.

4. The plug-in unit-mounting structure according to claim 1, wherein said mounting frame further includes an auxiliary frame part disposed at a intermediate location of said mounting frame.

5. The plug-in unit-mounting structure according to claim 1, wherein the plug-in units include one having a plurality of printed boards received in a box-shaped housing that can be mounted on said mounting frame.

6. The plug-in unit-mounting structure according to claim 1, wherein the plug-in unit is provided with a guide module at a location corresponding to the guide hole.

7. The plug-in unit-mounting structure according to claim 1, the structure further comprising:
 card levers provided in association with front slots of said shelf, for urging the plug-in units for insertion and removal thereof to and from said connectors.

8. The plug-in unit-mounting structure according to claim 7, wherein said card levers are provided on said mounting frames, respectively.

9. The plug-in unit-mounting structure according to claim 7, wherein said card lever is commonly provided for a plurality of said mounting frames.

10. The plug-in unit-mounting structure according to claim 1, wherein said mounting frame is formed to have a different frame width depending on a thickness of the printed board to be mounted on the plug-in unit.

11. The plug-in unit-mounting structure according to claim 1, wherein said guide rails are provided in a plurality of parallel rows, depending on a number of the plug-in units to be mounted.

12. The plug-in unit-mounting structure according to claim 1, wherein said mounting frames are received in said shelf in a manner layered in a vertical direction of said shelf.

13. An electronic apparatus comprising:
 a shelf comprising a back wiring board, and connectors and guide pins disposed separately on said back wiring board;
 a mounting frame removably fixed to said shelf before receiving any plug-in units, the mounting frame including:
 a vertical frame part having upper and lower ends and a guide hole for positioning said mounting frame in said shelf, such that said guide hole is engaged with one of the guide pins disposed on said back wiring board; and
 upper and lower frame parts respectively fixed to the upper and lower ends of the vertical frame part;
 guide rails provided on the upper and lower frame parts and having a length based on a size of a plug-in unit; and
 at least one plug-in unit that is mounted on said mounting frame and has a connector configured to be inserted and removed to and from one of the connectors provided on said back wiring board of said shelf.

* * * * *